United States Patent
Moran et al.

(10) Patent No.: US 10,026,714 B2
(45) Date of Patent: Jul. 17, 2018

(54) INTEGRATED CIRCUIT DEVICE

(71) Applicants: Robert Moran, Largs (GB); Derek Beattie, Glasgow (GB)

(72) Inventors: Robert Moran, Largs (GB); Derek Beattie, Glasgow (GB)

(73) Assignee: NXP USA, Inc., Austin, TX (US)

( * ) Notice: Subject to any disclaimer, the term of this patent is extended or adjusted under 35 U.S.C. 154(b) by 466 days.

(21) Appl. No.: 14/180,466

(22) Filed: Feb. 14, 2014

(65) Prior Publication Data

US 2015/0235998 A1    Aug. 20, 2015

(51) Int. Cl.
*H01L 25/065* (2006.01)

(52) U.S. Cl.
CPC ...... *H01L 25/0657* (2013.01); *H01L 25/0655* (2013.01); *H01L 2924/0002* (2013.01)

(58) Field of Classification Search
CPC .. G11C 29/44; G06K 19/072; H01L 23/3128; H01L 25/0655; H01L 2924/0002; H01L 29/78606; H01L 23/02
See application file for complete search history.

(56) References Cited

U.S. PATENT DOCUMENTS

| | | | | |
|---|---|---|---|---|
| 5,986,320 A * | 11/1999 | Kawano | ................. | G11C 29/44 257/209 |
| 6,731,011 B2 * | 5/2004 | Verma | ................. | G06K 19/072 257/676 |
| 8,996,906 B1 * | 3/2015 | Townley | ................... | G06F 1/10 326/101 |
| 2007/0132102 A1 * | 6/2007 | Nishimura | .......... | H01L 23/3128 257/758 |
| 2009/0015224 A1 * | 1/2009 | Hirao | .................... | H02M 3/158 323/282 |
| 2009/0021974 A1 * | 1/2009 | Nonomura | .............. | H01L 23/48 365/63 |

(Continued)

FOREIGN PATENT DOCUMENTS

WO       2006010903 A2     2/2006

OTHER PUBLICATIONS

Von Tils, V. et al., "Trends and Challenges in Automotive Electronics," 2006 IEEE; Proceedings of the 18th International Symposium on Power Semiconductor Devices & IC's; Jun. 4-8, 2006, Naples, Italy; ISBN: 0-7803-9714-2; 3 pages.

(Continued)

*Primary Examiner* — Mohsen Ahmadi

(57) ABSTRACT

Aspects of the invention relate to an integrated circuit device and method of production thereof. The integrated circuit device comprises at least one application semiconductor die comprising at least one functional component arranged to provide application functionality, at least one functional safety semiconductor die comprising at least one component arranged to provide at least one functional safety undertaking for the at least one application semiconductor die, and at least one System in Package, SiP, connection component operably coupling the at least one functional safety semiconductor die to the at least one application semiconductor die to enable the at least one functional safety semiconductor die to provide the at least one functional safety undertaking for the at least one application semiconductor die.

12 Claims, 4 Drawing Sheets

(56) References Cited

U.S. PATENT DOCUMENTS

| | | | | |
|---|---|---|---|---|
| 2011/0019650 A1* | 1/2011 | van Niekerk | ....... | H04L 65/1069 |
| | | | | 370/338 |
| 2013/0015590 A1* | 1/2013 | Haba | ................... | H01L 25/0652 |
| | | | | 257/778 |
| 2015/0234008 A1* | 8/2015 | Miller | ................ | G01R 31/3177 |
| | | | | 714/734 |

OTHER PUBLICATIONS

Atmel, "Automotive Microcontrollers," printed from >>http://www.atmel.com/products/automotive/automotive_microcontrollers/default.aspx>> on Feb. 12, 2014, 3 pages.

* cited by examiner

INTEGRATED CIRCUIT DEVICE

FIELD OF THE INVENTION

This invention relates to an integrated circuit device and method of production therefor.

BACKGROUND OF THE INVENTION

Functional safety is a trend that is increasing in automotive and industrial applications. For example, applications may be required to comply with a particular Safety Integrity Level (SIL). A SIL is defined as a relative level of risk-reduction provided by a safety function, or to specify a target level of risk reduction. In the European Functional Safety standards based on the IEC 61508 standard, four SILs are defined, with SIL 4 being the most dependable and SIL 1 being the least. The road vehicles functional safety standard IOS26262 defines four safety levels (ASIL A through D) that provide four different levels of system integrity. For example, an ASIL D level of integrity may be required for an electronic steering control system in a vehicle, where failure of the system could have fatal consequences.

A common way to implement functional safety requirements on, for example, a microcontroller device (MCU) is to implement specific hardware circuits that provide additional monitoring of the underlying microcontroller circuits (e.g. monitoring of the CPU) and software, thereby increasing the likelihood of a hardware or software error being caught.

However, such a requirement for functional safety is not common place in all applications, and it is often the case that a device, such as a microcontroller device, may be suitable for applications both with and without functional safety requirements. As some industrial/automotive and general purpose microcontroller architectures become more similar, there is a significant benefit to enable the re-use of, for example, a general purpose microcontroller (that typically does not require functional safety) in industrial and automotive markets that require functional safety by adding functional safety features.

However, functional safety can place a lot of additional requirements onto silicon design, and result in unnecessary unit overheads in terms of cost and power. If this is carried into markets that have no safety requirements, this adds unnecessary cost. As such, it is undesirable to implement functional safety into devices to be used for applications that do not require functional safety, since the additional costs can make it difficult to achieve competitively priced devices. However, not implementing functional safety into such devices prevents these devices from being used for applications that require functional safety.

SUMMARY OF THE INVENTION

The present invention provides an integrated circuit device, a functional safety semiconductor die, an application semiconductor die and a method of producing an integrated circuit device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
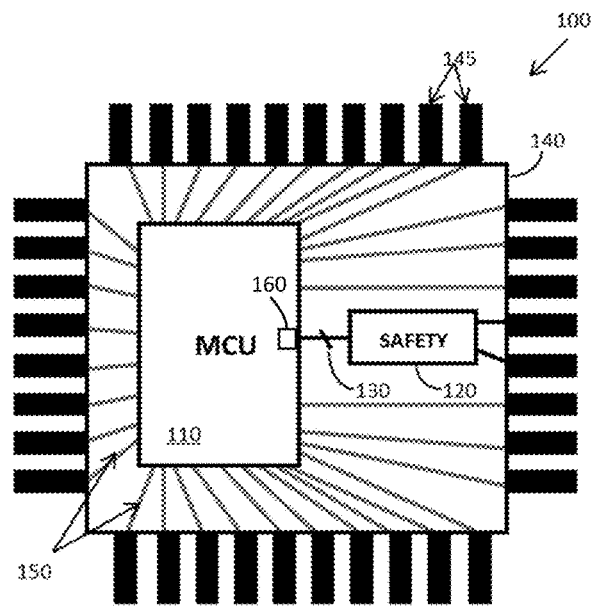
FIG. 1 illustrates a simplified plan view of an example of an integrated circuit (IC) device.

The present invention is herein described with reference to an integrated circuit device comprising a microcontroller or microprocessor device. However, it will be appreciated that the present invention is not limited to such integrated circuit devices, and may equally be applied to integrated circuit devices comprising any alternative type of operational functionality. Examples of such integrated circuit device comprising alternative types of operational functionality may include, by way of example only, application-specific integrated circuit (ASIC) devices, field-programmable gate array (FPGA) devices, etc. Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

According to an example of a first aspect of the present invention there is provided an integrated circuit device. The integrated circuit device comprises at least one application semiconductor die comprising at least one functional component arranged to provide application functionality, at least one functional safety semiconductor die comprising at least one component arranged to provide at least one functional safety undertaking for the at least one application semiconductor die, and at least one System in Package, SiP, connection component operably coupling the at least one functional safety semiconductor die to the at least one application semiconductor die to enable the at least one functional safety semiconductor die to provide the at least one functional safety undertaking for the at least one application semiconductor die.

In one optional example, the at least one application semiconductor die and the at least one functional safety semiconductor die may be packaged within a single integrated circuit package.

In one optional example, the at least one application semiconductor die may comprise no functional safety functionality.

In one optional example, the at least one SiP connection component may comprise at least one of:

a side by side, package substrate/interposer connection;
a side by side, wirebond connection;
a stacked die, copper pillar connection; and
a stacked die, wirebond die-to-die connection.

In one optional example, the at least one SiP connection component may be arranged to operably couple at least one internal signal of the at least one application semiconductor die to the at least one functional safety semiconductor die.

In one optional example, the at least one functional semiconductor die may be operably coupled to at least one pad ring of the at least one application semiconductor die.

In one optional example, the at least one functional safety semiconductor die may be arranged to provide at least one functional safety undertaking for the at least one application semiconductor die comprising at least one of:
controlled coupling of at least one input/output signal between the at least one application semiconductor die and at least one external contacts of an integrated circuit package of the integrated circuit device;
measurement and assessment of parametric information from the at least one application semiconductor die;
monitoring of at least one system signal and/or I/O state for the at least one application semiconductor die;
isolated Watchdog functionality for the at least one application semiconductor die; and
Black Box recording for the at least one application semiconductor die.

In one optional example, the at least one functional safety semiconductor may be arranged to comprise at least one power supply independent from the at least one application semiconductor die.

In one optional example, the at least one functional safety semiconductor die may be arranged to comprise at least one clock signal independent from the at least one application semiconductor die.

In one optional example, the at least one functional safety semiconductor die may be arranged to receive a clock signal from at least one of:
a dedicated external connection of an integrated circuit package within which the at least one functional safety semiconductor die is contained;
an internal reference clock; and
a clock signal recovered from a signal connection with the at least one application semiconductor die.

In one optional example, electrical isolation may be provided between the at least one application semiconductor die and the at least one functional safety semiconductor die.

In one optional example, electrical isolation may be provided on signal connections between the at least one application semiconductor die and the at least one functional safety semiconductor die.

Accordingly to example of a second aspect of the invention there is provided a functional safety semiconductor die for mounting with an integrated circuit device according to the first aspect of the invention. The functional safety semiconductor die comprises at least one component arranged to provide at least one functional safety undertaking for at least one application semiconductor die. The functional safety semiconductor die is arranged to be operably coupled to at least one application semiconductor die by way of at least one System in Package, SiP, connection component.

According to example of a third aspect of the invention there is provided an application semiconductor die for mounting with an integrated circuit device according to the first aspect of the invention. The application semiconductor die is arranged to be operably coupled to at least one functional safety semiconductor die by way of at least one System in Package, SiP, connection component.

In one optional example, the application semiconductor die may comprise at least one functional safety interface arranged to enable at least one functional safety semiconductor die to be operably coupled thereto by way of at least one System in Package, SiP, connection component and to provide at least one functional safety undertaking for the application semiconductor die.

According to an example of a fourth aspect of the invention there is provided a method of producing an integrated circuit device comprising functional safety functionality. The method comprises mounting at least one application semiconductor die comprising at least one functional component arranged to provide application functionality within an integrated circuit package, mounting at least one functional safety semiconductor die comprising at least one component arranged to provide at least one functional safety undertaking for the at least one application semiconductor die within the integrated circuit package, and operably coupling the at least one functional safety semiconductor die to the at least one application semiconductor die using at least one System in Package, SiP, connection component to enable the at least one functional safety semiconductor die to provide the at least one functional safety undertaking for the at least one application semiconductor die.

In one optional example, the at least one SiP connection component may comprise at least one of:
a side by side, package substrate/interposer connection;
a side by side, wirebond connection;
a stacked die, copper pillar connection; and
a stacked die, wirebond die-to-die connection.

Referring first to FIG. 1, there is illustrated a simplified plan view of an example of an integrated circuit (IC) device 100. The IC device 100 comprises one or more application semiconductor dies, such as the application semiconductor die indicated at 110, arranged to provide operational functionality for the IC device 100. The application semiconductor die(s) 110 comprise(s) one or more functional components (not shown) arranged to provide the operational functionality for which the IC device is intended. In some examples, the IC device 100 may comprise, say, a microcontroller or microprocessor device. As such, the application semiconductor die(s) 110 comprise(s) the various functional components (not shown) for providing the operational functionality of the microcontroller/microprocessor device.

The IC device 100 illustrated in FIG. 1 further comprises one or more functional safety semiconductor dies, such as the functional safety semiconductor die indicated at 120. The functional safety semiconductor die(s) 120 comprise(s) one or more functional safety components (not shown) arranged to provide at least one functional safety undertaking for the application semiconductor die(s) 110. The functional safety semiconductor die(s) 120 is operably coupled to the application semiconductor die(s) 110 by way of one or more System in Package (SiP) connection components, which in the example illustrated in FIG. 1 comprises one or more side by side wirebond connection(s) 130 that enable the functional safety semiconductor die(s) 120 to provide the functional safety undertaking(s) for the application semiconductor die(s) 110. Such side by side wirebond connection(s) 130 may be arranged to operably couple one or more internal signal(s) of the application semiconductor die(s) 110 to the functional safety semiconductor die(s) 120.

The functional safety semiconductor die(s) 120 may be arranged to provide any required and/or desired functional safety undertaking(s) for the application semiconductor die(s) 110. In some examples, the functional safety semiconductor die(s) 120 may be arranged to provide functional safety undertaking(s) required to comply with at least one Safety Integrity Level (SIL). Examples of functional safety undertakings that may be provided by the functional safety semiconductor die(s) 120 include, by way of example only:
- controlled coupling of one or more input/output signal(s) between the application semiconductor die(s) 110 and one or more external contacts of an IC package of the IC device 100, for example to enable/enforce a safe state mode of operation for the IC device 100;
- measurement and assessment of parametric information from the application semiconductor die(s) 110, such as voltage, current, temperature, etc.;
- monitoring of one or more system signals or I/O states for the application semiconductor die(s) 110 to determine a safe status therefor;
- isolated Watchdog functionality (challenge/response) for the application semiconductor die(s) 110; and
- 'Black Box' recording for the application semiconductor die(s) 110, for example storing a history of information pertaining to internal signals of application semiconductor die(s) 110 such as bus transactions, die temperature, overvoltage conditions, etc., and storing such information to on-die memory of the functional safety semiconductor die(s) 120 or to off-die memory.

In this manner, functional safety may be implemented substantially independently within one or more semiconductor die(s). Significantly, by implementing functional safety within one or more semiconductor die(s) separate from the application semiconductor die(s) 110, the application semiconductor die(s) 110 are suitable for use within applications that do not require functional safety, without the need to include the functional safety semiconductor die(s) 120. In this manner, the application semiconductor die(s) 110 may be reused for applications that do not require functional safety without the need for the costs etc. associated with the functional safety semiconductor die(s) 120 (e.g. the extra die costs etc.) having to be borne by those non-functional safety applications. Furthermore, by enabling the same application semiconductor die(s) 110 to be reused for applications that do not require functional safety development costs may be significantly reduced therefor.

In addition to the ability for the application semiconductor die(s) 110 to be reused within non-functional safety applications without carrying the costs of the functional safety semiconductor die(s) 120, the present invention provides the additional benefit of providing close-coupled, on-chip functional safety functionality for those applications that do require such functional safety. Advantageously, functional safety may be added to general purpose application semiconductor die(s) 110 suitable for (cost effective) applications that do not require functional safety, without the addition of a second IC device on a printed circuit board (PCB).

Significantly, the functional safety semiconductor die(s) 120 may be closely coupled to the application semiconductor die(s) 110, allowing access to signals not available in the pinout of the IC device 100. In addition, by providing the functional safety semiconductor die(s) 120 within the same IC package as the application semiconductor die(s) 110, common PCB faults may be avoided, improving reliability. In some examples, it is contemplated that the same pinout arrangement may be used in IC devices comprising both the application semiconductor die(s) 110 and the functional safety semiconductor die(s) 120 or just the application semiconductor die(s) 110. In this manner, common PCB hardware may also be reused between safety and non-safety applications. It is further contemplated that the functional safety semiconductor die(s) 120 may be implemented alongside existing (non-safety) application semiconductor die(s) 110, thereby enabling such application semiconductor die(s) 110 previously intended for use in applications that do not require functional safety to be reused in applications that do required functional safety.

Furthermore, the functional safety semiconductor die(s) 120 are not limited to being fabricated using the same technology process(es) as used for the application semiconductor die(s) 110. In this manner, a lower cost process may be used for the functional safety semiconductor die(s) 120, helping to reduce the overall cost of the IC device 100.

Referring back to FIG. 1, in the illustrated example the application semiconductor die(s) 110 and the functional safety semiconductor die(s) 120 are packaged within a single IC package 140, which in the example illustrated in FIG. 1 comprises a plurality of external contacts, such as those indicated generally at 145. In the example illustrated in FIG. 1, the application semiconductor die(s) 110 is/are operably coupled to external contacts 145 of the IC package 140 by way of bond wires, such as those indicated generally at 150. In a similar manner, the functional safety semiconductor die(s) 120 may also be operably coupled to one or more external contacts 145 of the IC package by, in the example illustrated in FIG. 1, wire bonds 150, for example to external contacts providing power supply and ground connections, etc. to the functional safety semiconductor die(s) 120.

Figure 2:
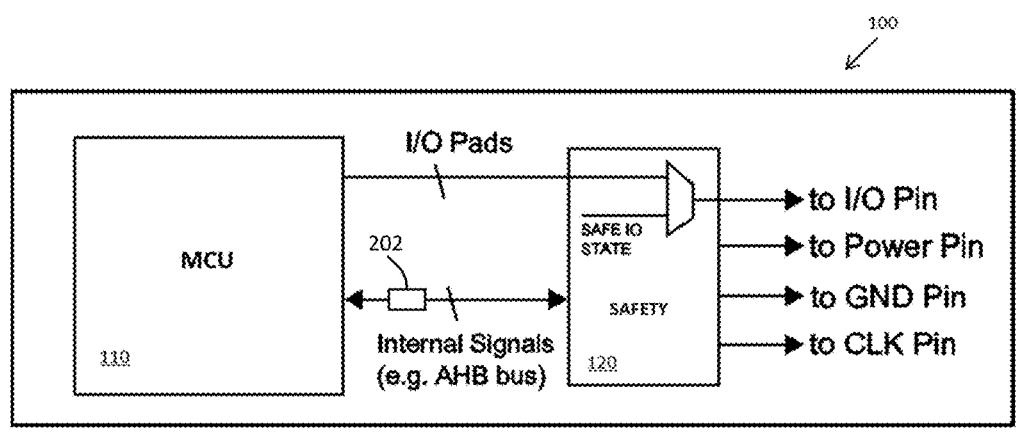
FIG. 2 illustrates a simplified block diagram of an example of an application semiconductor die and a functional safety semiconductor die operably coupled together by one or more SiP connection components.

FIG. 2 illustrates a simplified block diagram of an example of the application semiconductor die(s) 110 and the functional safety semiconductor die(s) 120 operably coupled together by one or more SiP connection components 130.

In some example, the functional safety semiconductor die(s) 120 may be operably coupled to external contacts arranged to provide dedicated functional safety semiconductor die power supply and ground connections. In this manner, the functional safety semiconductor die(s) 120 may be operably coupled to power supply and ground connections isolated from the application semiconductor die(s) 110. As such, the functional safety semiconductor die(s) 120 has/have the ability to operate independent of the application semiconductor die(s) 110. Thus, a failure on the application semiconductor die(s) 110 will not impact the functionality of the functional safety semiconductor die(s) 120. In some examples, the functional safety semiconductor die(s) 120 may additionally/alternatively be operably coupled to dedicated functional safety input/output signal external contacts.

In some examples, electrical isolation 202, in FIG. 2, may be provided between the application semiconductor die(s) 110 and the functional safety semiconductor die(s) 120. For example, electrical isolation 202 may be provided on signal connections between the application semiconductor die(s) 110 and the functional safety semiconductor die(s) 120 by way of, say, one or more fuses. In this manner, a failure on, say, the application semiconductor die(s) 110 will not to affect the operation of the functional safety semiconductor die(s) 120, or vice versa.

In some examples, the functional safety semiconductor die(s) 120 may be arranged to comprise at least one clock signal independent from clock signals of the application semiconductor die(s) 110. For example, the functional safety semiconductor die(s) 120 may be arranged to receive a clock signal from one or more:

a dedicated external connection of the IC package 140 of the IC device 100;

an internal reference clock; and/or a clock signal recovered from a signal connection with the application semiconductor die(s) 110.

In some examples, the functional safety semiconductor die(s) 120 may be operably coupled to at least one pad ring 160 of the application semiconductor die(s) 110.

In the example illustrated in FIG. 1, the functional safety semiconductor die(s) 120 is operably coupled to the application semiconductor die(s) 110 by way of one or more SiP connection components, which in the example illustrated in FIG. 1 comprises one or more side by side wirebond connection(s) 130 that enable the functional safety semiconductor die(s) 120 to provide the functional safety undertaking(s) for the application semiconductor die(s) 110. It will be appreciated that the present invention is not limited to the use of SiP connection components comprising such side by side wirebond connections 130, and any suitable alternative form of SiP connection coupling may additionally/alternatively be used to operably couple the functional safety semiconductor die(s) 120 to the application semiconductor die(s) 110.

In some examples, the application semiconductor die(s) 110 may comprise a functional safety interface arranged to enable the functional safety semiconductor die(s) 120 to be operably coupled thereto by way of one or more SiP connection components. Such a functional safety interface may simply comprise, say, internal signal connection points to enable the functional safety semiconductor die(s) 120 to be coupled thereto.

Figure 3:
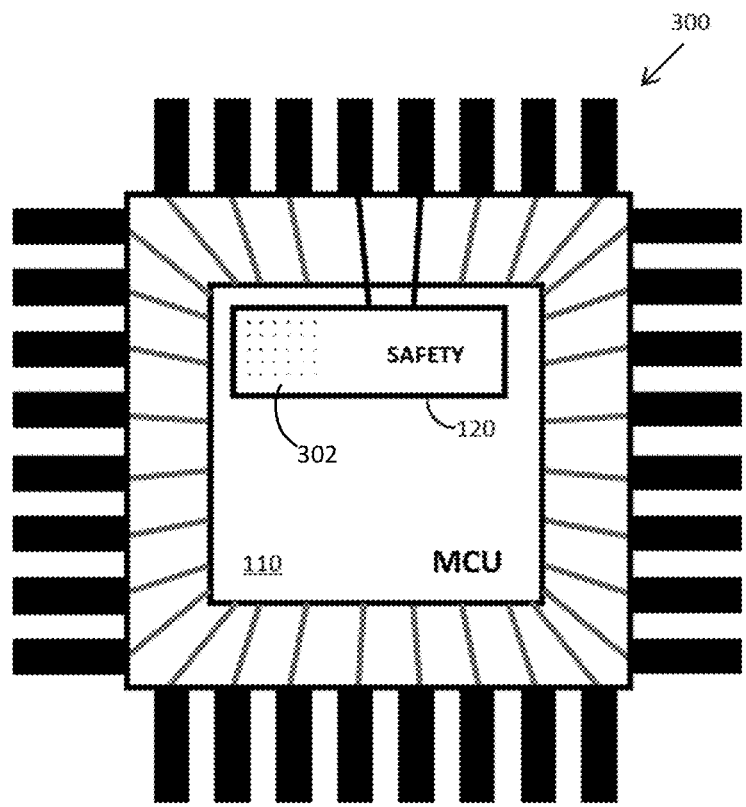
FIG. 3 illustrates a simplified plan view of an alternative example of an IC device.

FIG. 3 illustrates a simplified plan view of such an alternative example of an IC device 300 in which the functional safety semiconductor die(s) 120 is operably coupled to the application semiconductor die(s) 110 by way of one or more SiP connection components comprising stacked die, copper pillar connections. In this example of FIG. 3, the application semiconductor die(s) 110 and the functional safety semiconductor die(s) 120 are stacked vertically, and copper 'pillars' 302 are used to provide electrical connections between the stacked dies. Additionally/alternatively, the stacked application semiconductor die(s) 110 functional safety semiconductor die(s) 120 may be operably coupled by way of one or more wirebond die-to-die connections (not shown).

Figure 4:
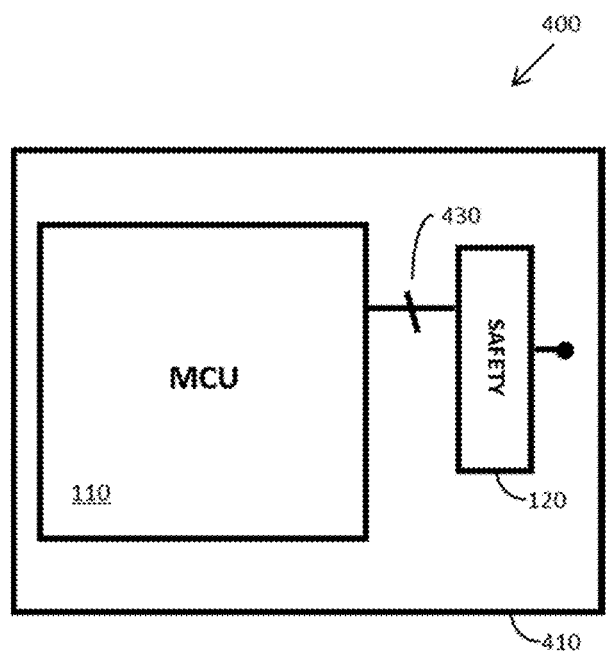
FIG. 4 illustrates a simplified plan view of a further alternative example of an IC device.

FIG. 4 illustrates a simplified plan view of a further alternative example of an IC device 400 in which the functional safety semiconductor die(s) 120 is operably coupled to the application semiconductor die(s) 110 by way of one or more side by side, package substrate/interposer connections 430. In this example of FIG. 4, the IC device 400 comprises a ball grid array (BGA) package with the application semiconductor die(s) 110 and the functional safety semiconductor die(s) 120 mounted on one or more BGA substrates 410 of the BGA package.

As will be appreciated, implementing functional safety within one or more semiconductor die(s) separate from the application semiconductor die(s) 110 as herein described provides various advantages over the prior art including, by way of example:

the avoidance of the need for duplicate costs of separate package and additional PCB materials for separate safety and non-functional safety applications;

improved reliability due to a lower likelihood of PCB faults and increased suitability for space constrained applications compared with implementing functional safety within a separate IC package;

internal functionality of the application semiconductor die(s) 110 can be exposed easily to the functional safety semiconductor die(s) 120 through the use of, for example, stacking two dies on top of one another and sharing internal signals, or providing additional internal signals on the pad ring of the application semiconductor die(s) 110 that may only be connected to the functional safety semiconductor die(s) 120 (i.e. not externally on the package).

In some examples of the present invention it is contemplated that the application semiconductor die(s) 110 may make specific internal signals available on, say, its pad ring or through die to die interconnects (such as Copper Pillars). The functional safety semiconductor die(s) 120 comprise hardware circuits that may be operably coupled to such internal signals made available by the application semiconductor die(s) 110 in order to extend the functionality of hardware circuits on the application semiconductor die(s) 110 to provide safety integrity checking.

For example, in a microprocessor device, 'Lock Step' functionality consists of two (or more) identical processor cores executing the same instruction stream (in sync, or with a delayed offset), and comparing the output of both processor cores data buses & critical output signals with each other to ensure they produce the same response. If a difference is detected, this would indicate a fault in a HW circuit of one processor core. The functionality of an application semiconductor die 110 comprising a 'non-Lock Step' processor core may be extended to comprise 'Lock Step' functionality by coupling a functional safety semiconductor die 120 a with a 'Checker' core thereto.

In such an example, the application semiconductor die 110 would expose the essential signals for the core bus interface to the SOC architecture (i.e. instruction & data bus, bus clock, etc . . . ) to a die to die interconnect (e.g. Copper pillar landing pads on top side of the application semiconductor die 110). The functional safety semiconductor die 120 would consists of a logic design with one (or more) 'Checker' processor cores replicating the processor core(s) on the application semiconductor die 110. The 'Checker' core(s) are able to connect to the essential signals for the core bus interface to the SOC architecture provided by the application semiconductor die 110 using the die to die interconnect. This ensures that the 'Checker' processor core(s) executes the same instruction stream and receives the same data stream as the application semiconductor die 110 processor core(s).

The functional safety semiconductor die 120 may also include logic to compare the output signals (e.g. data bus) of the application semiconductor die 110 processor core(s) with the respective 'Checker' cores output signals. If a compare operation detects a difference between the outputs of the processor cores, it can signal an event that may be handled by logic on either the application semiconductor die 110 or the functional safety semiconductor die 120 (e.g. using a dedicated die to die signal). For example, the application semiconductor die 110 may include a Fault Handler Module which the functional safety semiconductor die 120 can transmit compare mismatch events to using the die to die interconnect.

In this manner, when the application semiconductor die 110 is packaged without the functional safety semiconductor die 120, the packaged MCU will not contain any 'lock step' functionality. Conversely, when the application semiconductor die 110 and functional safety semiconductor die 120 are stacked together (e.g. using Copper Pillar interconnects) the overall packaged MCU is able to provide 'Lock Step' functionality.

In some alternative example of the present invention it is contemplated that the application semiconductor die(s) 110 may make specific internal resources visible on, say, its pad ring or through die to die interconnects (such as Copper Pillars), to allow these resources to be monitored. For example, routing a system bus to a die to die interconnect could allow a functional safety semiconductor die 120 to perform memory read accesses. In this manner, the functional safety semiconductor die(s) 120 may be implemented as a subsystem, consisting of both hardware and software which monitors the operations performed by the application semiconductor die(s) 110, and verifies that the expected results of these operations fall within a set of safe boundaries.

For example, there are various applications where a general purpose MCU (with no safety features) would be suited to controlling specific external circuits that can cause damage to the application, or user of the application, if the control of the external circuit fails. For example, controlling a motorized robotic arm, or monitoring CAN (Controller Area Network) messages sent within a vehicle network. The present invention enables such a general purpose MCU to be used in such circumstances by providing an independent level of monitoring for specific control signals within an application. The application semiconductor die 110 may provide no dedicated signals for use with a functional safety semiconductor die 120. This may typically be, for example, an MCU with no specific considerations for safety integrity monitoring. The functional safety semiconductor die 120 may use a combination of hardware circuits and (or not) software to monitor the output or input status of one (or more) I/O signals from the application semiconductor die 110.

For a specific I/O signal, the application semiconductor die 110 pad for the respective signal may be connected (e.g. wire bonded) to a pad on the functional safety semiconductor die 120, then a different pad on the functional safety semiconductor die 120 may be connect to the package pin for the respective I/O signals. The respective application semiconductor die 110 I/O signal may thus be routed through circuits on the functional safety semiconductor die 120, with such circuits monitoring if the expected I/O response is within a set of 'safe' boundaries, and only fed through to the package pin if this is true. If a 'non-safe' condition was detected, the functional safety semiconductor die 120 may gate an input from the package pin to the application semiconductor die 110 (or vice versa for an output). In this condition, the functional safety semiconductor die 120 may also indicate an error to a dedicated package pin, and/or directly to the application semiconductor die 110 using a pre-existing input pad on the application semiconductor die 110 (e.g. an external interrupt signal). It may also place the package pin, or application semiconductor die 110 pad into a safe state.

It is also possible that the functional safety semiconductor die 120 may only monitor the I/O signal, but not gate the signal. In this case the signal from the application semiconductor die 110 I/O pad would be connected to both the application semiconductor die 110 pad and the package pin.

The functional safety semiconductor die 120 hardware circuits may monitor the electrical characteristics of an I/O (such as voltage, current) or time or domain attributes of the signals (e.g. Pulse width, duty cycle, frequency, etc.). The combination of hardware circuits and software of the functional safety semiconductor die 120 may extend the monitoring of I/O into more complex algorithms including pattern matching of serial or parallel I/Os. (e.g. matching invalid messages transmitted over the CAN_TX I/O). It may also include state machines for a nested evaluation of one (or multiple) I/O signals (i.e. if, then, else compare operations).

For a given compare method, the functional safety semiconductor die 120 may contain a set of 'safe' or 'non-safe' conditions, which may be stored in local or external memory, or dynamically created, to be used to compared to the measured parameter for the I/O(s) being monitored. This will indicate if the safety integrity of the I/O(s) has been breached.

The functional safety semiconductor die 120 may have electrical isolation from the application semiconductor die 110. It may be powered & clocked by dedicated pins on the package. Alternatively, at the compromise of electrical isolation, it may share power and clocks from the same package pins used by the application semiconductor die 110.

The functional safety semiconductor die 120 may provide means to electrically isolate the connected I/O signal between the package pin and the application semiconductor die 110. One implementation would be to create a fused connection on the functional safety semiconductor die 120 between the application semiconductor die 110 I/O and the package pin. On detection of a non-safe condition (e.g. over-current on the I/O) the fuse may be blown to electrically isolate the application semiconductor die 110 from the package pin.

In an alternative example, the functional safety semiconductor die 120 may be arranged to monitor that the control functions being performed on the application semiconductor die 110 adhere to a certain safety integrity level. For example, the functional safety semiconductor die 120 may be arranged to read memory mapped contents of the application semiconductor die 110 to monitor that specific memory contents and register values are within 'safe' conditions. By routinely comparing the application data memory for the application semiconductor die 110 against expected values the functional safety semiconductor die 120 is able to determine the integrity of the application data.

By way of example, the application semiconductor die 110 may consist of an MCU with an SoC bus master connection available using die to die interconnects. The application semiconductor die 110 may also expose other signals (e.g. Interrupt signals) to the functional safety semiconductor die 120. The functional safety semiconductor die 120 may consist of an MCU with an SoC bus slave connection available using die to die interconnects. When the application semiconductor die 110 and functional safety semiconductor die 120 are interconnected by way of an SiP connection, a processor core of the functional safety semiconductor die 120 processor core will be able to issue read accesses to the memory mapped contents of the bus slaves (e.g. typically memories and peripheral registers) within the application semiconductor die 100.

The functional safety semiconductor die 120 may consist of hardware circuits that connect to a bus interface of the application semiconductor die 110, and the processor core of the functional safety semiconductor die 120 is able to execute software that monitors the contents of the memory mapped contents of the application semiconductor die 110. The functional safety semiconductor die 120 is also able to issue read accesses to the memory mapped contents of the application semiconductor die 110. The data from the read access may thus be compared to known values stored on the functional safety semiconductor die 120 which determine a 'safe' or 'non-safe' state for the data. If a 'non-safe' state is found, the functional safety semiconductor die 120 may flag an error event to the application semiconductor die 110 using a dedicated die to die interconnect signal (e.g. an interrupt signal on the application semiconductor die 110). Alternatively, the functional safety semiconductor die 120 may update the contents of a specific memory location (e.g. setting an interrupt bit in a register or modifying a data value) using the existing bus interface.

In each of the above examples, the functional safety semiconductor die(s) 120 may connect to the application semiconductor die(s) 110 using an electrical connection (e.g. a wirebond) between a pad ring of the application semiconductor die(s) 110 and a pad ring of the functional safety semiconductor die(s) 120. Alternatively, the functional safety semiconductor die(s) 120 may connect to the application semiconductor die(s) 110 using die to die interconnects (e.g. Copper Pillars) which allow signals not routed to the pad ring to be connected between two semiconductor dies stacked on top of one another.

Figure 5:
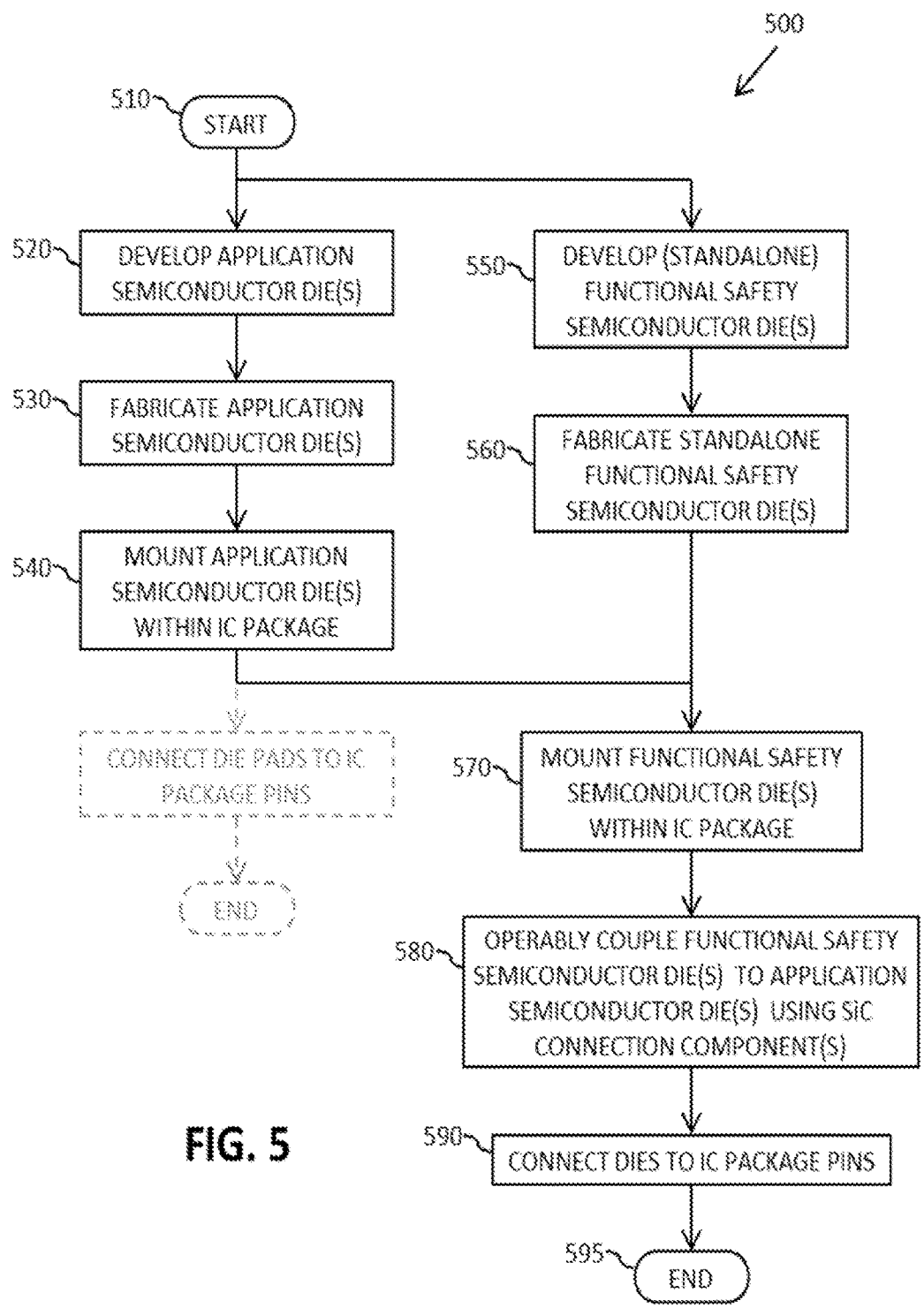
FIG. 5 illustrates a simplified flowchart of an example of a method of producing an IC device comprising functional safety functionality.

Referring now to FIG. 5, there is illustrated a simplified flowchart 500 of an example of a method of producing an IC device comprising functional safety functionality. The method starts at 510, and divides into two semiconductor die development and fabrication threads. A first development and fabrication thread comprises developing one or more application semiconductor die(s) for the IC device, such as the application semiconductor die(s) 110 illustrated in FIG. 1. The application semiconductor die(s) are then fabricated at 530. A second development and fabrication thread comprises developing one or more (standalone) functional safety semiconductor die(s), such as the functional safety semiconductor die(s) 120 illustrated in FIG. 1. The functional safety semiconductor die(s) are then fabricated at 560.

The fabricated application semiconductor die(s) is/are then mounted within an IC package at 540. The fabricated functional safety semiconductor die(s) are then also mounted within the IC package, at 570. The functional safety semiconductor die(s) are then operably coupled to the application semiconductor die(s) using one or more SiC connection component(s), at 580. In some examples, the step of operably coupling the functional safety semiconductor die(s) to the application semiconductor die(s) using one or more SiC connection component(s) may alternatively form an integral part of the mounting of the functional safety semiconductor die(s) within the IC package.

The application semiconductor die(s) and functional safety semiconductor die(s) are then connected to the IC package external contacts at 590, for example by way of wire bonds or the like, and the method ends at 595. It will be appreciated that although in the example illustrated in FIG. 5 the application semiconductor die(s) have been illustrated and described as being mounted within the IC package first, followed by the functional safety semiconductor die(s). However, it will be appreciated that in alternative examples the functional safety semiconductor die(s) may be mounted within the IC package before the application semiconductor die(s).

As previously mentioned, by implementing functional safety within semiconductor dies separate from the application semiconductor dies, the application semiconductor dies are suitable for use within applications that do not require functional safety, without the need to include the functional safety semiconductor dies. In this manner, the application semiconductor dies may be reused for applications that do not require functional safety without the need for the costs etc. associated with the functional safety semiconductor dies (e.g. the extra die costs etc.) having to be borne by those non-functional safety applications. Furthermore, by enabling the same application semiconductor dies to be reused for applications that do not require functional safety development costs may be significantly reduced.

Figure 6:
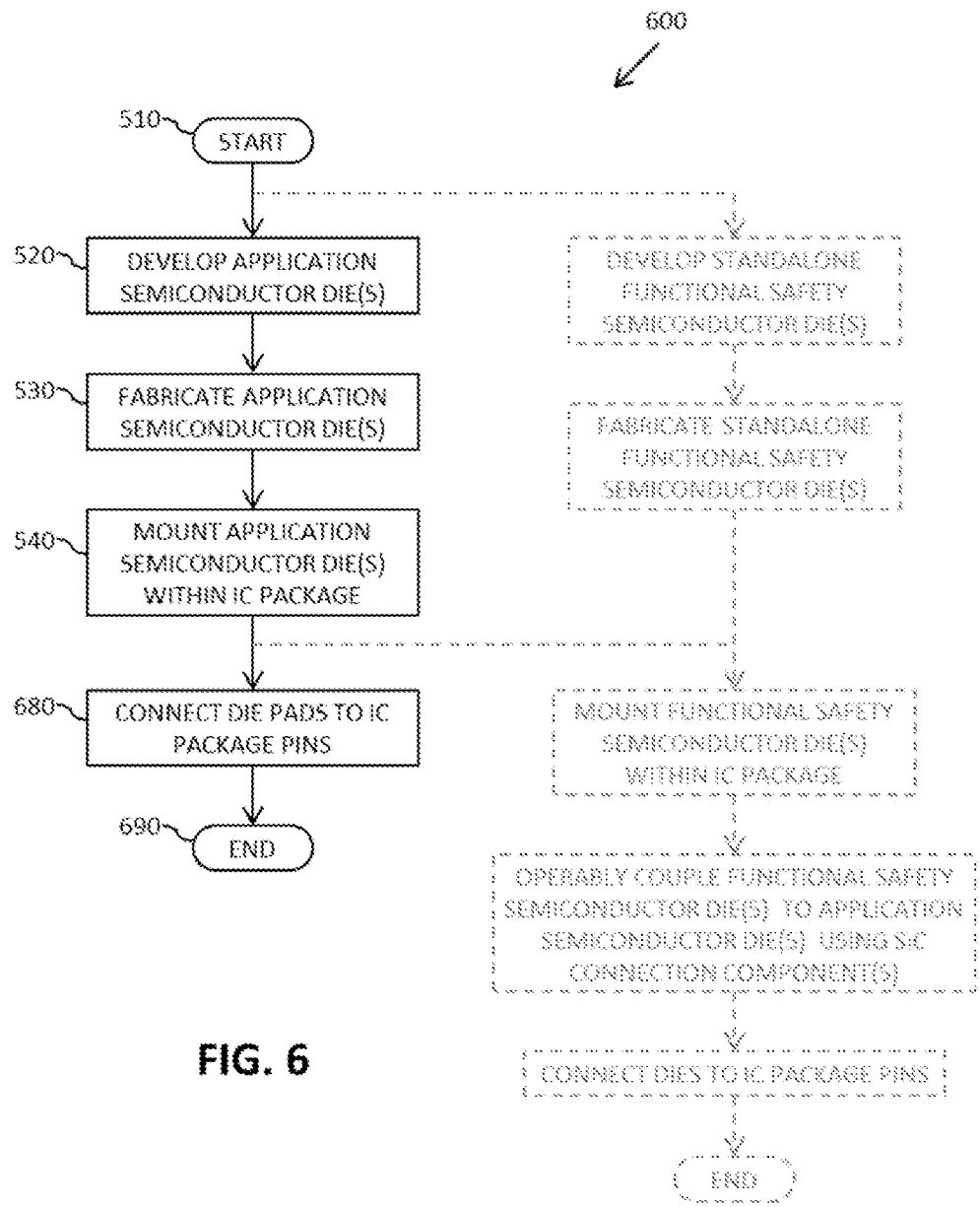
FIG. 6 illustrates a simplified flowchart of an example of a method of producing an IC device without functional safety functionality.

For example, FIG. 6 illustrates a simplified flowchart 600 of an example of a method of producing an IC device without functional safety functionality, whereby the application semiconductor die(s) of the method of FIG. 5 are reused. The method of FIG. 6 starts at 600, and reuses the first development and fabrication thread of the method of FIG. 5 in which the application semiconductor die(s) is/are developed at 520 and fabricated at 530. The fabricated application semiconductor die(s) is/are then mounted within an IC package at 540. The method of FIG. 6 then moves on to 680 where the application semiconductor die(s) is/are connected to the IC package external contacts, and the method ends at 690.

Thus, and as illustrated in FIGS. 5 and 6, development costs etc. for the development of the application semiconductor die(s) may be shared at 520. Furthermore, shared fabrication and assembly stages 530, 540 enable greater economies of scale to be achieved, thereby enabling the fabrication and assembly costs etc. to be reduced.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or an limits any particular claim containing such introduced claim element to inventions containing only one such element, even when the same claim includes the introductory phrases one or more or at least one and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. An integrated circuit device comprising:
   an application semiconductor die comprising a functional component arranged to provide application functionality;
   a functional safety semiconductor die comprising a component arranged to monitor activities of the functional component and to provide functional safety undertaking of the application semiconductor die based on the monitored activities of the functional component, the functional safety semiconductor die comprises a power supply connection that is independent from a power supply connection of the application semiconductor die; and
   a System in Package (SiP) connection component to electrically couple the functional safety semiconductor die to the application semiconductor die such that the functional safety semiconductor die provides the functional safety undertaking for the application semiconductor die,
   wherein:
      the application semiconductor die comprises no functional safety functionality,
      the functional safety semiconductor die is arranged to comprise a clock signal independent from the application semiconductor die,
      electrical isolation of signals is provided between the application semiconductor die and the functional safety semiconductor die,
      the electrical isolation of the signals is provided on signal connections between the application semiconductor die and the functional safety semiconductor die by one or more fuses,
   wherein the functional safety semiconductor die is arranged to provide functional safety undertaking for the application semiconductor die comprising:
      controlled coupling of an input/output signal between the application semiconductor die and an external contact of an integrated circuit package of the integrated circuit device,
      measurement and assessment of parametric information from the application semiconductor die, and
      monitoring of a system signal and/or input/output state for the application semiconductor die, and
   wherein the functional safety semiconductor die is arranged to receive the clock signal from at least one of:
      a dedicated external connection of an integrated circuit package within which the a functional safety semiconductor die is contained,
      an internal reference clock, and
      a clock signal recovered from a signal connection with the application semiconductor die.

2. The integrated circuit device of claim 1, wherein the application semiconductor die and the functional safety semiconductor die are packaged within a single integrated circuit package.

3. The integrated circuit device of claim 1, wherein the SiP connection component comprises at least one of:
   a side by side, package substrate/interposer connection;
   a side by side, wirebond connection;
   a stacked die, copper pillar connection; and
   a stacked die, wirebond die-to-die connection.

4. The integrated circuit device of claim 1, wherein the SiP connection component is arranged to operably couple an internal signal of the application semiconductor die to the functional safety semiconductor die.

5. The integrated circuit device of claim 1, wherein the functional safety semiconductor die is operably coupled to a pad ring of the application semiconductor die.

6. The integrated circuit device of claim 1, wherein the functional safety semiconductor die is arranged to provide functional safety undertaking for the application semiconductor die further comprising:
   isolated Watchdog functionality for the application semiconductor die; and
   Black Box recording for the application semiconductor die.

7. The application semiconductor die of claim 1, wherein the application semiconductor die comprises a functional safety interface arranged to enable a functional safety semiconductor die to be operably coupled thereto by way of a System in Package, SiP, connection component and to provide a functional safety undertaking for the application semiconductor die.

8. A method of producing an integrated circuit device comprising functional safety functionality, the method comprising:
   mounting at least one application semiconductor die comprising at least one functional component arranged to provide application functionality within an integrated circuit package;
   mounting at least one functional safety semiconductor die comprising at least one component arranged to provide functional safety undertaking for the at least one application semiconductor die within the integrated circuit package, the functional safety semiconductor die comprises a power supply connection that is independent from a power supply connection of the application semiconductor die, wherein the functional safety semiconductor die is arranged to comprise a clock signal independent from the application semiconductor die and is arranged to provide functional safety undertaking for the application semiconductor die comprising:
      controlled coupling of an input/output signal between the application semiconductor die and an external contact of an integrated circuit package of the integrated circuit device,
      measurement and assessment of parametric information from the application semiconductor die, and
      monitoring of a system signal and/or input/output state for the application semiconductor die;
   electrically coupling the at least one functional safety semiconductor die to the at least one application semiconductor die using at least one System in Package (SiP) connection component such that the at least one functional safety semiconductor die to provide the at least one functional safety undertaking for the at least one application semiconductor die; and providing electrical isolation of signals between the application semiconductor die and the functional safety semiconductor die, wherein the electrical isolation of the signals is provided on signal connections between the application semiconductor die and the functional safety semiconductor die by one or more fuses, wherein the functional safety semiconductor die is arranged to receive the clock signal from at least one of:
a dedicated external connection of an integrated circuit package within which the a functional safety semiconductor die is contained,
an internal reference clock, and
a clock signal recovered from a signal connection with the application semiconductor die.

9. The method of claim 8, wherein the at least one SiP connection component comprises at least one of:
a side by side, package substrate/interposer connection;
a side by side, wirebond connection;
a stacked die, copper pillar connection; and
a stacked die, wirebond die-to-die connection.

10. An integrated circuit device comprising:
an application semiconductor die comprising a microprocessor device, the microprocessor device having a first power supply connection and a first ground connection;
a functional safety semiconductor die comprising a component having a second power supply connection and to a second ground connection, wherein the first power supply connection is isolated from the second power supply connection, and the first ground connection is isolated from the second ground connection, the component arranged to monitor activities of the microprocessor and to provide a safety undertaking of the application semiconductor die based on the monitored activities of the functional component; and
a System in Package (SiP) connection component to electrically couple the functional safety semiconductor die to the application semiconductor die to enable the functional safety semiconductor die to provide signal from the microprocessor to the component, wherein:
the functional safety semiconductor die is arranged to comprise a clock signal independent from the application semiconductor die,
electrical isolation of a signals is provided between the application semiconductor die and the functional safety semiconductor die,
the electrical isolation of the signals is provided on signal connections between the application semiconductor die and the functional safety semiconductor die by one or more fuses, wherein the functional safety semiconductor die is arranged to provide functional safety undertaking for the application semiconductor die comprising:
controlled coupling of an input/output signal between the application semiconductor die and an external contact of an integrated circuit package of the integrated circuit device,
measurement and assessment of parametric information from the application semiconductor die, and
monitoring of a system signal and/or input/output state for the application semiconductor die, and wherein the functional safety semiconductor die is arranged to receive the clock signal from at least one of:
a dedicated external connection of an integrated circuit package within which the a functional safety semiconductor die is contained,
an internal reference clock, and
a clock signal recovered from a signal connection with the application semiconductor die.

11. The integrated circuit device of claim 10, wherein the SiP connection component comprises at least one of:
a side by side, package substrate/interposer connection;
a side by side, wirebond connection;
a stacked die, copper pillar connection; and
a stacked die, wirebond die-to-die connection.

12. The integrated circuit device of claim 10, wherein the functional safety semiconductor die receives a first clock signal that is independent from a second clock signal received by the application semiconductor die.

\* \* \* \* \*